(12) United States Patent
Chang

(10) Patent No.: US 6,337,913 B1
(45) Date of Patent: Jan. 8, 2002

(54) WIRELESS TRANSMITTER/RECEIVER CIRCUIT SYSTEM WITH FLOATING FREQUENCY TRACING FUNCTION FOR A WIRELESS AUDIO EQUIPMENT

(76) Inventor: Keng-Yuan Chang, No. 70, Chang-An 6th St., Taiping City, Taichung County (TW)

( * ) Notice: Subject to any disclaimer, the term of this patent is extended or adjusted under 35 U.S.C. 154(b) by 0 days.

(21) Appl. No.: 09/270,729

(22) Filed: Mar. 16, 1999

(51) Int. Cl.[7] .................................................. H04H 5/00
(52) U.S. Cl. .............................. 381/14; 381/2; 370/343; 370/345
(58) Field of Search ............................ 381/14, 2, 4, 6, 381/15, 16; 370/339, 343, 345

(56) References Cited

U.S. PATENT DOCUMENTS 5,001,757 A * 3/1991 Field ............................ 381/14
5,119,503 A * 6/1992 Mankovitz .................... 381/14
5,299,264 A * 3/1994 Schotz ......................... 381/14
5,581,617 A * 12/1996 Schotz ......................... 381/14

* cited by examiner

*Primary Examiner*—Minsun Oh Harvey
(74) *Attorney, Agent, or Firm*—Rosenberg, Klein & Lee

(57) ABSTRACT

A wireless transmitter/receiver circuit system having a transmitter circuit and a receiver circuit, that enable a wireless headphone or speaker system to automatically trace floating frequency upon receiving of a transmitting signal, so as to achieve a quality receiving. The transmitter circuit includes a pilot oscillator and a 32K~1 MHz selector, that are controlled to encrypt transmitting signal, enabling transmitting signal to be accurately received by the receiver circuit. The receiver circuit has a concealed receiving antenna installed in a metal shell for direct coupling by air, a pilot select, a digital logic and a scan driver for automatically scanning signal transmitted from the transmitter circuit, enabling transmitted signal from the transmitter circuit to be accurately provided to the headphone or speaker system.

1 Claim, 5 Drawing Sheets

WIRELESS TRANSMITTER/RECEIVER CIRCUIT SYSTEM WITH FLOATING FREQUENCY TRACING FUNCTION FOR A WIRELESS AUDIO EQUIPMENT

BACKGROUND OF THE INVENTION

The present invention relates to a wireless transmitter/receiver circuit system for a wireless audio equipment, and more particularly to such a wireless transmitter/receiver circuit system which enables a wireless headphone or speaker system to automatically trace floating frequency upon receiving of a transmitting signal, so as to achieve a quality receiving.

In a wireless audio system, a high-frequency transmitter is installed in the main unit of the audio system for audio output wirelessly, and a high-frequency receiver is installed in the headphone or speaker system of the audio system to receive radio output signal from the high-frequency transmitter at the main unit. This design has numerous drawbacks as outlined hereinafter.

1. The oscillator of the high-frequency transmitter tends to be affected by temperature, causing a "frequency floating". The straight line receiving operation of the high-frequency receiver, as shown in FIG. 5, cannot accurately trace the floating frequency, thereby causing a receiving distortion. Therefore, a correction is needed when the audio system is started again, or when the high-frequency transmitter is controlled to change the channel (frequency).
2. Because the high-frequency transmitter of the transmitter and receiver system does not have the function of encrypting transmitting signal and the high-frequency receiver of the transmitter and receiver system is not capable of automatically scanning and comparing received signal, the transmitter and receiver system cannot fit frequency floating.
3. Because an additional matching circuit is used to match with the transmitting antenna of the transmitter, the structure of the transmitter is complicated, and the operation of the transmitting antenna tends to be affected by other oscillator means.

SUMMARY OF THE INVENTION

The present invention has been accomplished to provide a wireless transmitter/receiver system which eliminates the aforesaid drawbacks. According to one aspect of the present invention, the transmitter circuit of the wireless transmitter/receiver system uses a stereo multiplexer and a 32K~1 MHz select to encrypt transmitting signal. According to another aspect of the present invention, the receiver circuit of the wireless transmitter/receiver system comprises a digital logic, a scan driver, an auto gain control, a stereo decode, a VCO tone, a pilot select, and a pilot make test. During operation, the receiver circuit automatically scan transmitting signal from the transmitter circuit, automatically adjust its scanning range, and automatically tracing the floating of the received signal, so as to achieve a high receiving performance. According to still another aspect of the present invention, the receiver circuit has a concealed receiving antenna installed in a metal shell for direct coupling by air. This design eliminates the installation of a complicated matching circuit. According to still another aspect of the present invention, the transmitter circuit uses a level control power standby to automatically turn the circuit to a standby mode when no transmitting signal is outputted. According to still another aspect of the present invention, the circuit system achieves the function of "automatically tracing floating frequency", it is not necessary to correct the receiving manually.

DETAILED DESCRIPTION OF THE PREFERRED EMBODIMENT

Figure 1:
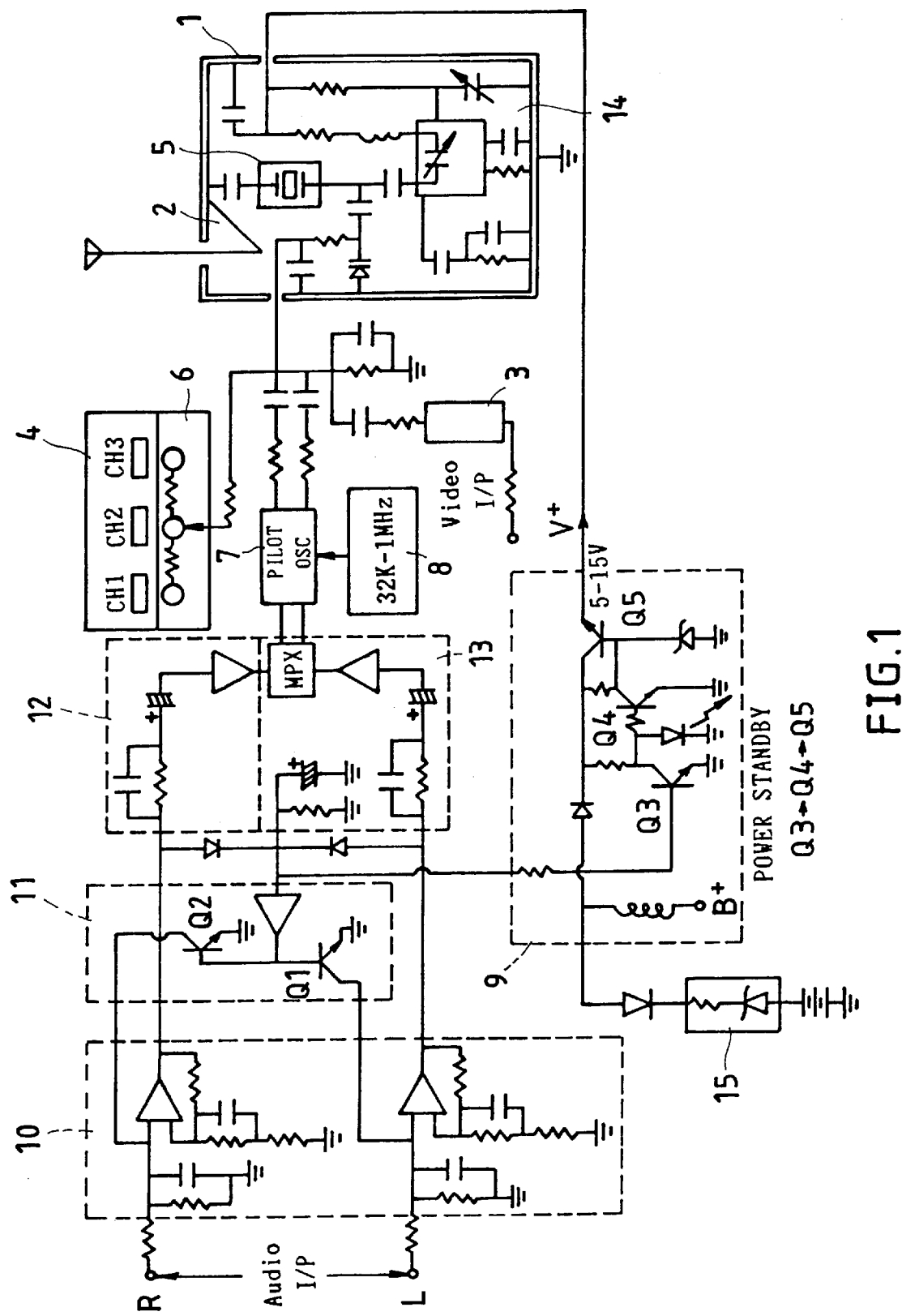
FIG. 1 is a circuit diagram of a transmitter circuit for a transmitter/receiver circuit system according to the present invention.
Figure 3:
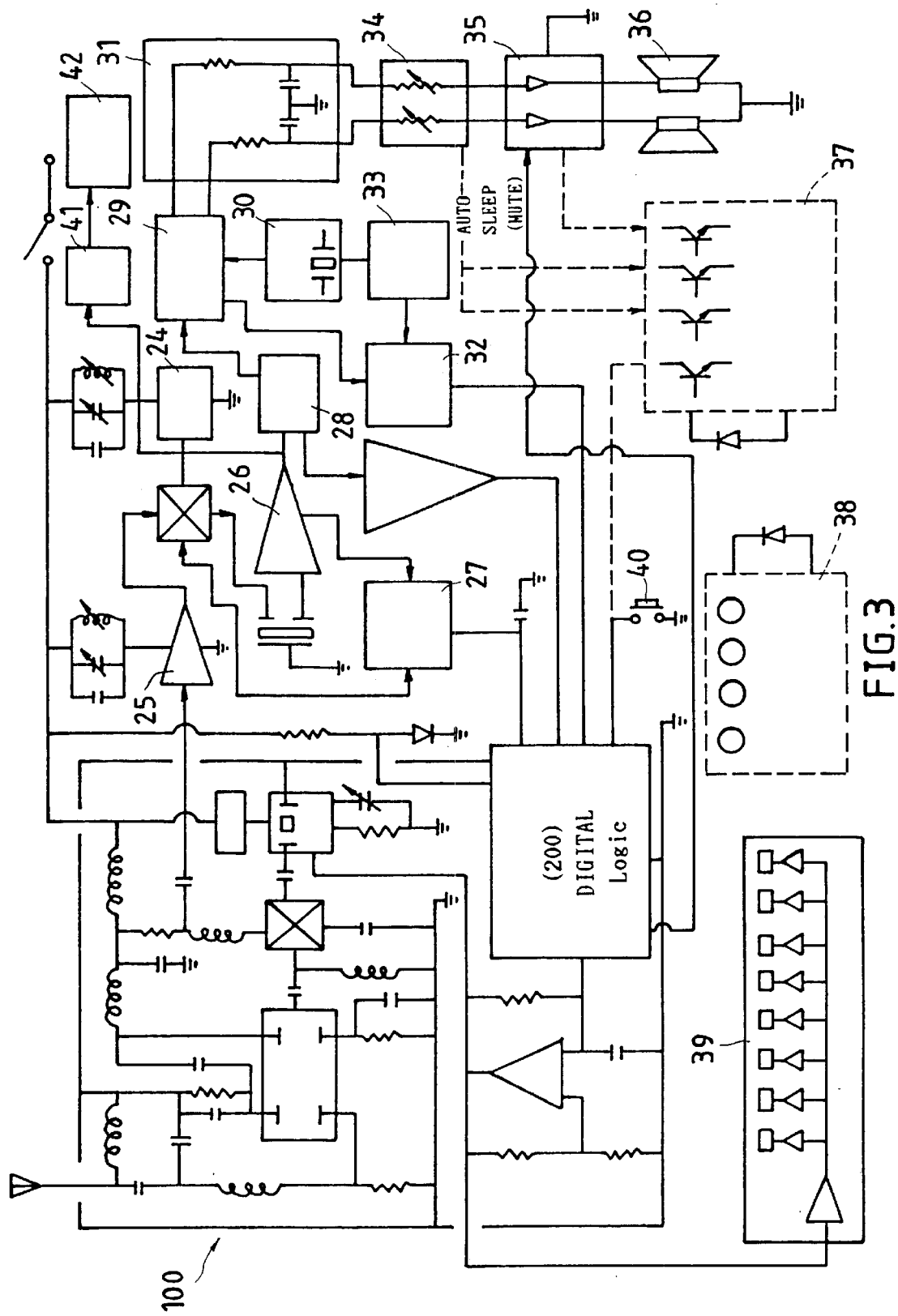
FIG. 3 is a circuit diagram of a receiver circuit for a transmitter/receiver circuit system according to the present invention.

Referring to FIGS. 1 and 3, a wireless transmitter/receiver circuit system in accordance with the present invention comprises a transmitter circuit and a receiver circuit. The transmitter circuit is comprised of an audio amplifier 10, a deviation limit 11, a pre-emphasis 12, a stereo multiplexer 13, a radio frequency oscillation driver 14, a battery charger 15, a channel select 6, a radio frequency oscillator 5, a channel display 4, and a video input 3. The receiver circuit is comprised of an antenna radio frequency amplifier 20, a mixer 21, a scan driver 22, a first frequency demultiplier 100 having a 1 GHz~2 GHz local oscillator 23, a 100K~300 MHz local oscillator 24, a first IF (intermediate frequency) pass 25, a second IF (intermediate frequency) amplifier 26, an AGC (automatic gain control) 27, a FM (frequency modulation) detector 28, a stereo decode 29, a de emphasis 31, a volume control 34, a power driver and mute 35, speakers 36, a channel select 40, a video output 41, and a video display 42.

The characteristics of the present invention are outlined hereinafter. The stereo multiplexer 13 of the transmitter circuit, as shown in FIG. 1, comprises a pilot oscillator 7 for accurate signal guiding, and a 32K~1 MHz select 8 for encrypting transmitting signal to prevent a mixing of noises. A level control power standby 9 is connected between the radio frequency driver 14 and the circuit of the deviation limit 11, pre emphasis 12 and stereo multiplexer 13. The level control power standby 9 is comprised of three transistors Q3, Q4 and Q5, and a diode. It is connected to the compression amplifier of the deviation limit 11, and then connected to its transistors Q1 and Q2. The transistors Q3, Q4 and Q5 of the level control power standby 9 are turned on/off subject to the presence of signal input to be transmitted, thereby causing the transmitter circuit to be set at the off status or the standby status. The radio frequency oscillation driver 14 is covered within a metal shell 1. The antenna of the radio frequency oscillation driver 14 is directly coupled to the metal shell 1, and spaced from the oscillator 140 at a distance. Air in the metal shell 1 between the oscillator 140 and the antenna achieves a capacity effect, therefore the antenna is directly coupled to the oscillator 140, and no additional antenna matching circuit is required. This design saves parts and space.

The receiver circuit comprises a VCO (voltage controlled oscillator) tone 30 and a pilot select 33. The VCO tone 30 and the pilot select 33 are connected to the FM detector 28. The output value ol the pilot select 33 is set subject to the encrypted value from the transmitter unit, and transmitted through the FB detector 28 to the first frequency demultiplier 100. The first frequency demultiplier 100 comprises a digital logic 200, a scan driver 22, and a mixer 21, and receives signal from the second FM amplifier 26 and AGC 27 and signal from the FM detector 28 and stereo decode 29. Therefore, the first frequency demultiplier 100 automatically scans, traces, compares, and handles signals from these transmitter signals, and outputs a control signal to the pilot make test 32, causing the stereo decode 29 to provide the matched transmitting frequency for the de emphasis 31 for accurate working. Further, a scan display 39 is connected to the digital logic 200 to display scanned frequency range.

Figure 2:
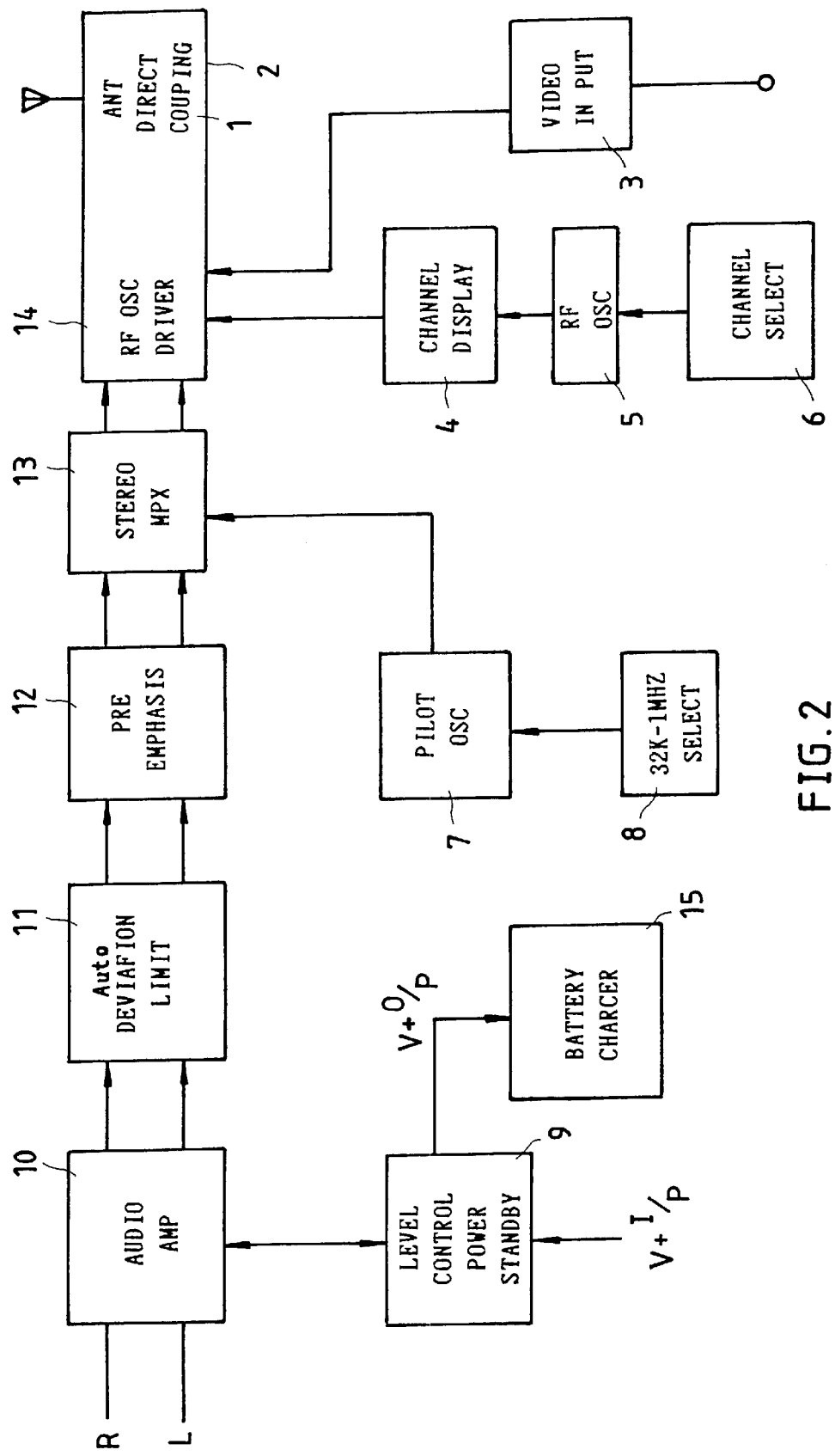
FIG. 2 is a circuit block diagram of the transmitter circuit shown in FIG. 1.

The action, control, and effect of the present invention are outlined hereinafter. With respect to signal transmitting:

As illustrated in FIGS. 1 and 2, the signal to be transmitted through the transmitter circuit is amplified by the audio amplifier 10, then processed through the level control power standby 9 to eliminate ambient noises, and then processed through the deviation limit 11 to limit its normal working range, so that a stereo signal is obtained. The stereo signal thus obtained is then reinforced by the pre emphasis 12 to drop its noise level, and then processed through the stereo multiplexer 13, and then sent to the RF oscillation driver 14, causing it to output an oscillatory signal to the conceived antenna direct coupling 2 between the oscillator of the RF oscillation driver 14 and the metal shell 1 for transmitting into the air through the antenna.

The features of the receiver circuit are outlined hereinafter:

1. The receiver circuit comprises a 32K~1 MHz select 8 and a pilot oscillator 7 for code setting, enabling the transmitted signal to be carried with a code.
2. The level control power standby 9 comprises transistors Q3, Q4 and Q5. Because the level control power standby 9 is controlled by the transistors Q1 and Q2 of the deviation limit 11, signal transmitting operation can be executed only when transistors Q3, Q4 and Q5 are electrically connected. Connection of transistors Q1 and Q2 is subject to sufficient signal bias. When R, L input signal intensity to the audio amplifier 10 is lowered to about the background noise, the transistors Q1 and Q2 are off, therefore the transistors Q3, Q4 and Q5 are off, and the transmitting function is off. On the contrary, when an input signal is received by the audio amplifier 10, the transistors Q1 and Q2 are turned on, therefore the transistors Q3, Q4 and Q5 are turned on, and the transmitting function is on. This automatic transmitting function control is subject to a deviation limit, however it achieves an efficient operation. For example, the audio equipment is automatically turned off upon the end of the playing of a music tape or CD; the radio is automatically turned off and changed to auto sleep (mute) mode upon the end of the broadcasting of the radio station.
3. Because the antenna is of ¼ wavelength and directly coupled to the metal shell 1 at about 1~8 mm from the oscillator, a direct coupling is provided for the transmitting of a carrier signal without any additional matching circuit. The protection of the metal shell 1 eliminates the interference of outside noises.

Figure 4:
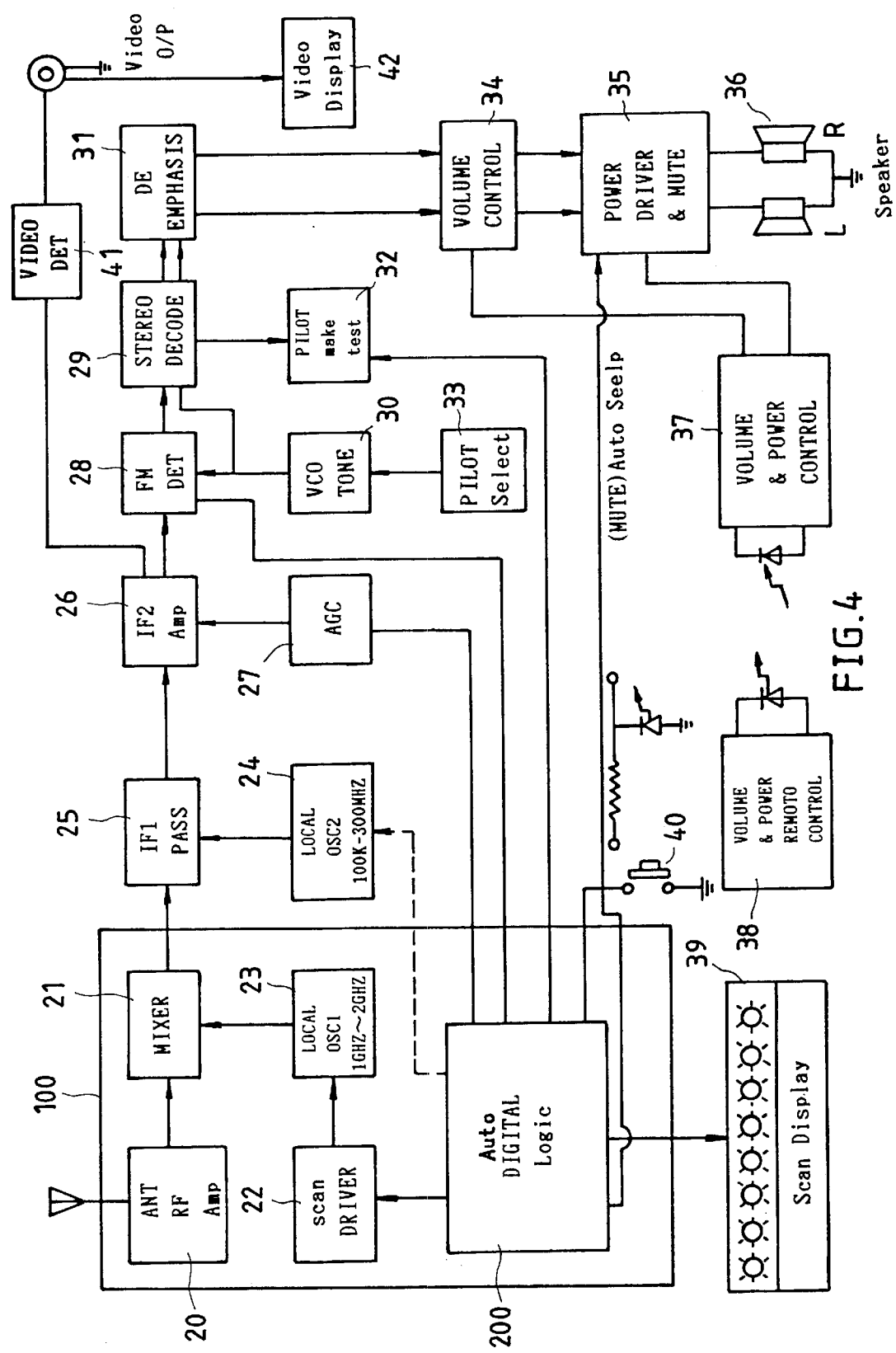
FIG. 4 is a circuit block diagram of the receiver circuit shown in FIG. 3.
Figure 5:
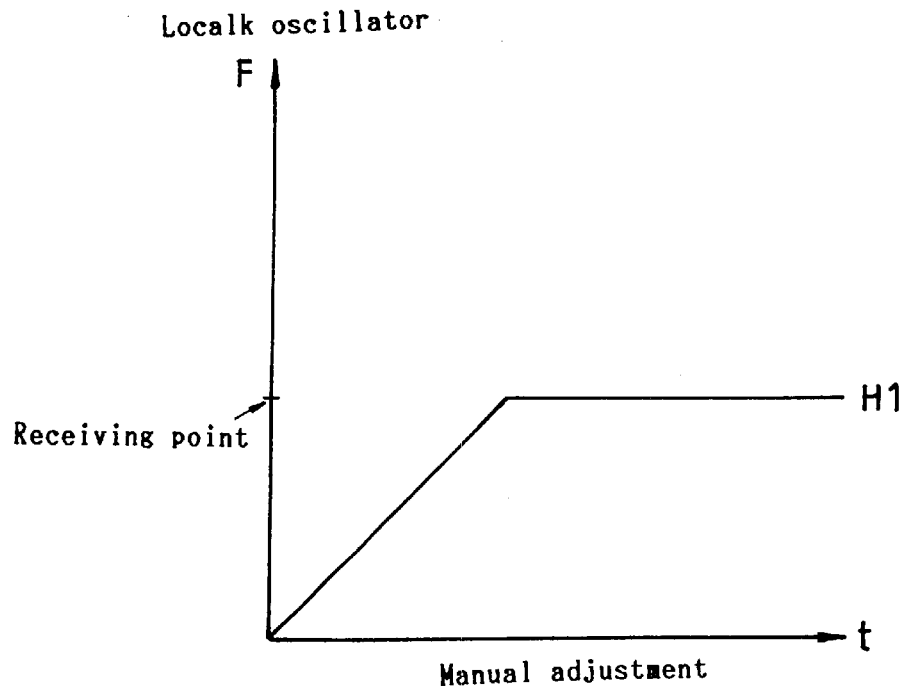
FIG. 5 is a frequency receiving chart according to the prior art.
Figure 6:
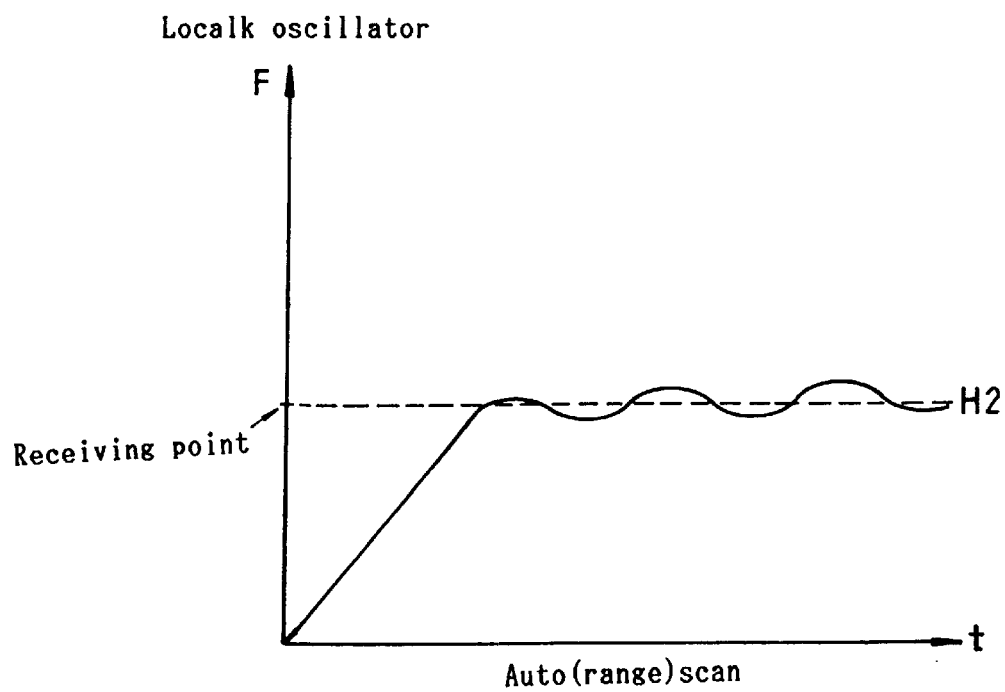
FIG. 6 is a frequency receiving chart according to the present invention.

With respect to "signal receiving", please refer to FIGS. 3 and 4. Upon receipt of a signal by the antenna of the first frequency demultiplier 100, the signal is sent to the antenna radio frequency amplifier 20, then processed through the mixer 21 and the first local oscillator 23 of frequency within 1 GHz~2 GHz, so that a signal of 100 Hz~300 MHz is outputted to the first IF pass 25. The signal is then treated by the second local oscillator 24 of frequency within 100K~300 MHz, and then filtered through the second IF amplifier 26, and then processed through the AGC 27 to maintain its strength, and then processed through the FM detector 28 to filter radio frequency signal. The signal is then sent from the FM detector 28 through the stereo decode 29 and the de emphasis 31 to provide the required value, and then sent to the headphone speaker for output. During this receiving procedure, the present invention achieves the following characteristics:

1. There is at least one frequency demultiplier (first local oscillator 23, second local oscillator 24). Conventionally, channel selection is made by controlling the frequency of the second local oscillator. The present invention achieves channel selection by controlling the frequency of the first local oscillator 23. Further, the present invention provides a scan driver 22 and a digital logic 200 to control the frequency of the first local oscillator within 1 GHz~2 GHz (it is automatically scanned; the automatic scanning operation will be described later), so as to minimize variation of harmonic wave and interference of noises.
2. During the receiving procedure, the stereo decode 29 outputs a signal to the digital logic 200, i.e., received signal is automatically traced (see FIG. 6), therefore it fits floating frequency. By means of the operation of the pilot select 33 and the pilot make test 32, the receiving of a signal can be locked.
3. Received signal can be encrypted and locked by 38 KHz. A variable code can be used for multi-channel recognition, so that quick scan tracing can be achieved when signal transmitting and signal receiving are simultaneously proceeded. Channel memory or manual channel selection can be selectively operated. Therefore, when the transmitting frequency is changed, it still can be automatically traced and locked without any manual control.
4. The digital logic 200 enables the radio transmitter/receiver circuit system to have a local oscillator that automatically changes its scanning range (>±2 MHz). When a transmitting signal having a guide signal is detected, the digital logic 200 automatically narrows the scanning range to ±100 KHz~500 KHz (see FIG. 6). The digital logic 200 automatically changes the scanning range upon detection of a channel (frequency) change or frequency floating, so as to achieve a normal signal receiving operation, i.e., the circuit has the capability of automatically locking a variable transmitting frequency. For example, if the transmitting frequency is 918 MHz and the first intermediate frequency is 130 MHz, it scans the frequency range within 1048 MHz±100 KHz~1048 MHz±500 KHz automatically. When the transmitting signal is off, the scanning range is automatically returned to 1048 MHz±2 MHz~1048 MHz±5 MHz.
5. The scan display 39 is provided to indicate the value of the range of the transmitting frequency by LEDs during the scanning operation of the digital logic 200, enabling the user to know the receiving condition.
6. A volume and power control 37 and a volume and power remote control 38 are provided for infrared transmitting/receiving remote control operation.

In practice, the transmitter circuit of the present invention can be installed in a microphone, V8 video camera, CD player, etc., enabling transmitting signal to be sent to a speaker system or computer wirelessly.

It is to be understood that the drawings are designed for purposes of illustration only, and are not intended as a definition of the limits and scope of the invention disclosed.

What the invention claimed is:

1. A wireless transmitter/receiver circuit system comprising transmitter circuit and a receiver circuit, said transmitter circuit comprising an audio amplifier, a deviation limit, a pre-emphasis, a stereo multiplexer, a radio frequency oscillation driver, a battery charger, a channel select, a radio frequency oscillator, a channel display, and a video input, said receiver circuit comprising an antenna radio frequency amplifier, a mixer, a scan driver, a first frequency demultiplier having a 1 GHz~2 GHz local oscillator, a 100K~300 MHz local oscillator, a first IF (intermediate frequency) pass, a second IF (intermediate frequency) amplifier, an AGC (automatic gain control), a FM (frequency modulation) detector, a stereo decode, a de emphasis, a volume control, a power driver and mute, speakers, a channel select, a video output, and a video display, wherein:

said stereo multiplexer of said transmitter circuit comprises a pilot oscillator for accurate signal guiding, and a 32K~1 MHz select for encrypting transmitting signal to prevent a mixing of noises; a level control power standby is connected between said radio frequency driver and the circuit of said deviation limit and said pre emphasis and said stereo multiplexer, said level control power standby being comprised of three transistors and a diode and connected to a compression amplifier of said deviation limit and then transistors of said deviation limit, the transistors of said level control power standby being turned on/off subject to the presence of the signal to be transmitted; said radio frequency oscillation driver is covered within a metal shell, having an antenna directly coupled to said metal shell and spaced from an oscillator thereof at a distance, enabling air in said metal shell between the oscillator and the antenna to achieve a capacity effect to let the antenna to be directly coupled to the oscillator; said receiver circuit comprises a VCO (voltage controlled oscillator) tone and a pilot select, said VCO tone and said pilot select being connected to said FM detector, the output value of said pilot select is set subject to the encrypted value from said transmitter unit and transmitted through said FB detector to said first frequency demultiplier; said first frequency demultiplier comprises a digital logic, a scan driver, and a mixer, and receives signal from said second FM amplifier and said AGC and signal from said FM detector and said stereo decode, so as to automatically scan, trace, compare, and handle signals from said transmitter circuit, and to output a control signal to said pilot make test, causing said stereo decode to provide the matched transmitting frequency for said de emphasis for accurate working.

* * * * *